United States Patent
Dao et al.

(10) Patent No.: US 9,024,639 B2
(45) Date of Patent: May 5, 2015

(54) GROUND FAULT DETECTION SYSTEM

(75) Inventors: Yuan Dao, Phoenix, AZ (US); William Schlanger, Flagstaff, AZ (US)

(73) Assignee: Elite Power Solutions LLC, Tempe, AZ (US)

( * ) Notice: Subject to any disclaimer, the term of this patent is extended or adjusted under 35 U.S.C. 154(b) by 719 days.

(21) Appl. No.: 13/077,145

(22) Filed: Mar. 31, 2011

(65) Prior Publication Data

US 2012/0249154 A1  Oct. 4, 2012

(51) Int. Cl.
| | | |
|---|---|---|
| G01R 31/14 | (2006.01) | |
| G01R 31/02 | (2006.01) | |
| B60L 3/00  | (2006.01) | |
| G01R 31/36 | (2006.01) | |
| G01R 31/00 | (2006.01) | |

(52) U.S. Cl.
CPC .......... *G01R 31/025* (2013.01); *G01R 31/3627* (2013.01); *G01R 31/006* (2013.01); *B60L 3/0069* (2013.01)

(58) Field of Classification Search
CPC ............. G01R 31/025; G01R 31/3627; G01R 31/006; B60L 3/0069
USPC ................................................. 324/509–510
See application file for complete search history.

(56) References Cited

U.S. PATENT DOCUMENTS

| | | | | |
|---|---|---|---|---|
| 4,188,574 A * | 2/1980 | Allington | ................... | 324/509 |
| 4,809,123 A * | 2/1989 | Allington et al. | ............... | 361/42 |
| 5,064,104 A * | 11/1991 | Milton et al. | ................. | 222/306 |
| 5,363,047 A * | 11/1994 | Dresti et al. | ................... | 324/510 |
| 5,510,658 A * | 4/1996 | Nakayama | ................... | 307/10.1 |
| 5,682,314 A * | 10/1997 | Nishino et al. | ................ | 701/29.1 |
| 6,031,354 A * | 2/2000 | Wiley et al. | ................... | 320/116 |
| 6,218,647 B1* | 4/2001 | Jones | ............................ | 219/501 |
| 7,049,825 B2* | 5/2006 | Carruthers | .................... | 324/509 |
| 7,821,413 B2* | 10/2010 | Fox et al. | ....................... | 340/649 |
| 2002/0125837 A1* | 9/2002 | Noda et al. | ..................... | 315/225 |
| 2003/0234653 A1* | 12/2003 | Kollenda et al. | ............. | 324/551 |
| 2004/0157091 A1* | 8/2004 | Dewey et al. | ................... | 429/12 |
| 2004/0199343 A1* | 10/2004 | Cardinal et al. | ............... | 702/63 |
| 2005/0036249 A1* | 2/2005 | Harvey | .......................... | 361/42 |
| 2008/0174922 A1* | 7/2008 | Kimbrough | .................... | 361/42 |
| 2009/0015434 A1* | 1/2009 | Fox et al. | ................. | 340/870.37 |
| 2009/0295401 A1* | 12/2009 | Kamata | ........................ | 324/509 |

(Continued)

FOREIGN PATENT DOCUMENTS

JP       2009270999 A  * 11/2009

OTHER PUBLICATIONS http://www1.electusdistribution.com.au/images_uploaded/optocoup.pdf.*

(Continued)

*Primary Examiner* — Patrick Assouad
*Assistant Examiner* — Demetrius Pretlow
(74) *Attorney, Agent, or Firm* — Invention To Patent Services; Alex Hobson

(57) ABSTRACT

The present application describes, among other things, a ground fault detection system. The system includes an optocoupler, a current sink, and a first voltage source connected in series. The first voltage source can connect to a negative terminal of a battery unit. Upon connection between a positive terminal of the battery unit and a first node at a ground zero reference level, current can flow through the optocoupler and the current sink to cause the optocoupler to output a ground fault detection signal.

17 Claims, 2 Drawing Sheets

(56) References Cited

U.S. PATENT DOCUMENTS

2010/0007312 A1*  1/2010  Petkov .......................... 322/44
2010/0123465 A1*  5/2010  Owens et al. ................. 324/503
2011/0025341 A1*  2/2011  Lupaczyk et al. ............ 324/509
2011/0115564 A1*  5/2011  Tung ............................ 330/298
2011/0286134 A1*  11/2011  Zylstra et al. .................. 361/42

OTHER PUBLICATIONS https://www.fairchildsemi.com/ds/FO/FOD3180.pdf.*

* cited by examiner

GROUND FAULT DETECTION SYSTEM

BACKGROUND

In battery-operated electrical systems, isolating the battery from an enclosure (e.g., the chassis of an electric vehicle) can prevent electric shock to service personnel who may accidentally contact the enclosure while working on the battery. Current systems for detecting the connection between the enclosure and the battery (also referred to herein as connection or ground faults) rely on complex circuits when direct current is used. Some of these circuits include voltage dividers positioned across the battery. The circuits determine that a ground fault is present based on the value of a voltage measured on the voltage divider. Further, these circuits can include comparators, switched capacitors, and other components to ensure stable operation in the presence of noise. The number and arrangement of components thus make ground fault detection systems expensive to manufacture.

SUMMARY

The invention is directed to a ground fault detection system can detect a connection between any terminal of any battery unit in a battery pack and a node at a potential below the zero-voltage reference level (e.g., the most negative battery terminal). The node can be an enclosure or a chassis. In particular, an optocoupler and a current sink can be connected in series to the enclosure, and a voltage source can be connected in series to the negative terminal of a battery unit. When any terminal of the battery units in the battery pack contacts the enclosure, current flows through a light emitting diode, LED, of the optocoupler and activates a transistor of the optocoupler. As the transistor conducts, the optocoupler outputs a logic high signal to indicate a ground fault has been detected In one aspect, the present disclosure describes a ground fault detection system. The system includes an optocoupler, a current sink, and a first voltage source connected in series. The first voltage source connects to a negative terminal of a battery unit. Upon connection between any terminal of the battery unit and a first node at a ground zero reference level, current flows through the optocoupler and the current sink to cause the optocoupler to output a ground fault detection signal.

The first node at a ground zero reference level can be a chassis of an electric vehicle. The ground fault detection signal can be a logic high signal. The optocoupler can output a logic low signal when the current does not flow through the optocoupler. The optocoupler can include a light emitting diode (LED) and a transistor. The current can flow through the light emitting diode to cause the transistor to conduct, and the conducting transistor can cause the optocoupler to output the ground fault detection signal.

The light emitting diode can be connected to first and second terminals of the optocoupler and the transistor can be connected to third and fourth terminals of the optocoupler. The first terminal of the optocoupler can connect to a second node at the ground zero reference level, the second terminal of the optocoupler can connect to the current sink, the third terminal of the optocoupler can connect to a second voltage source, and the fourth terminal of the optocoupler can connect to a resistor connected in series with a third node at a zero voltage reference level. The current can flow through the light emitting diode from the first terminal of the optocoupler to the second terminal.

The second voltage source and the second node at the second zero voltage reference level can be electrically isolated from the battery pack, and may be a separate portion of a chassis of an electric vehicle. The second voltage source can be a 3.3V source. A positive terminal of the first voltage source can connect to the negative terminal of the battery unit, and a negative terminal of the first voltage source can connect to the current sink. The first voltage source can be a 5V source. The current sink can limit the current flowing through the optocoupler and the current sink to about 2 mA. The current sink can operate at a voltage exceeding about 5V. The current sink can include a third voltage source, one or more transistors, and one or more resistors. In the event of a ground fault, the third voltage source, the one or more transistors, and the one or more resistors can be configured to form an equilibrium so that the current flowing through the current sink is a substantially constant current. Any of the transistors can be a metal-oxide-semiconductor field-effect transistor (MOSFET), an insulated gate bipolar transistor (IGBT), of an NPN transistor.

In another aspect, the present disclosure describes a ground fault detection system with an optocoupler with a light emitting diode and a transistor, a current sink connected to the light emitting diode of the optocoupler, and a first voltage source with a negative terminal connected to the current sink and a positive terminal connected to a negative terminal of a battery unit. Upon connection between any terminal of the battery unit and a chassis of an electric vehicle, current flows through the light emitting diode of the optocoupler and the current sink, and the light emitting diode activates the transistor such that the optocoupler outputs a ground fault detection signal.

In another aspect, the present disclosure describes a method of detecting a ground fault. The method includes connecting a positive terminal of a voltage source to a negative terminal of a battery unit, connecting a terminal of a battery unit to a node at a ground zero reference level, flowing a current through a light emitting diode of an optocoupler and a current source, and activating a transistor of the optocoupler such that the optocoupler outputs a ground fault detection signal. The method can also include deactivating the transistor of the optocoupler when the positive terminal of the battery unit is not connected to the node at the ground zero reference level, and connecting a terminal of the optocoupler to the ground zero reference level such that the optocoupler outputs a signal indicating that a ground fault is not detected.

BRIEF DESCRIPTION OF THE DRAWINGS

The foregoing and other objects, aspects, features, and advantages of the present invention will become more apparent and better understood by referring to the following description taken in conjunction with the accompanying drawings, in which.

DETAILED DESCRIPTION

The present disclosure describes, among other things, certain embodiments of a ground fault detection system. The ground fault detection system can connect to a battery unit. When the system detects that a terminal of the battery unit has connected to a zero-voltage reference level (also referred to herein as, "ground" or a "ground zero reference level"), the system can output a signal indicating that a ground fault has been detected. A ground fault response system can respond to the signal by, for example, an outputting an audible or visible alarm or signaling a component to interrupt current flow to an enclosure or chassis.

The ground fault detection system can be used in various contexts. For example, the system can connect to battery units of a battery pack for an electric vehicle. If one of the battery units contacts the vehicle's chassis, the ground fault detection system can detect the ground fault and output a signal. In another example, the ground fault detection system can connect to a back-up battery located in an electrical cabinet. The ground fault detection system can be used to sound an alarm to alert service personnel to the presence of a potential electric shock hazard.

Figure 1:
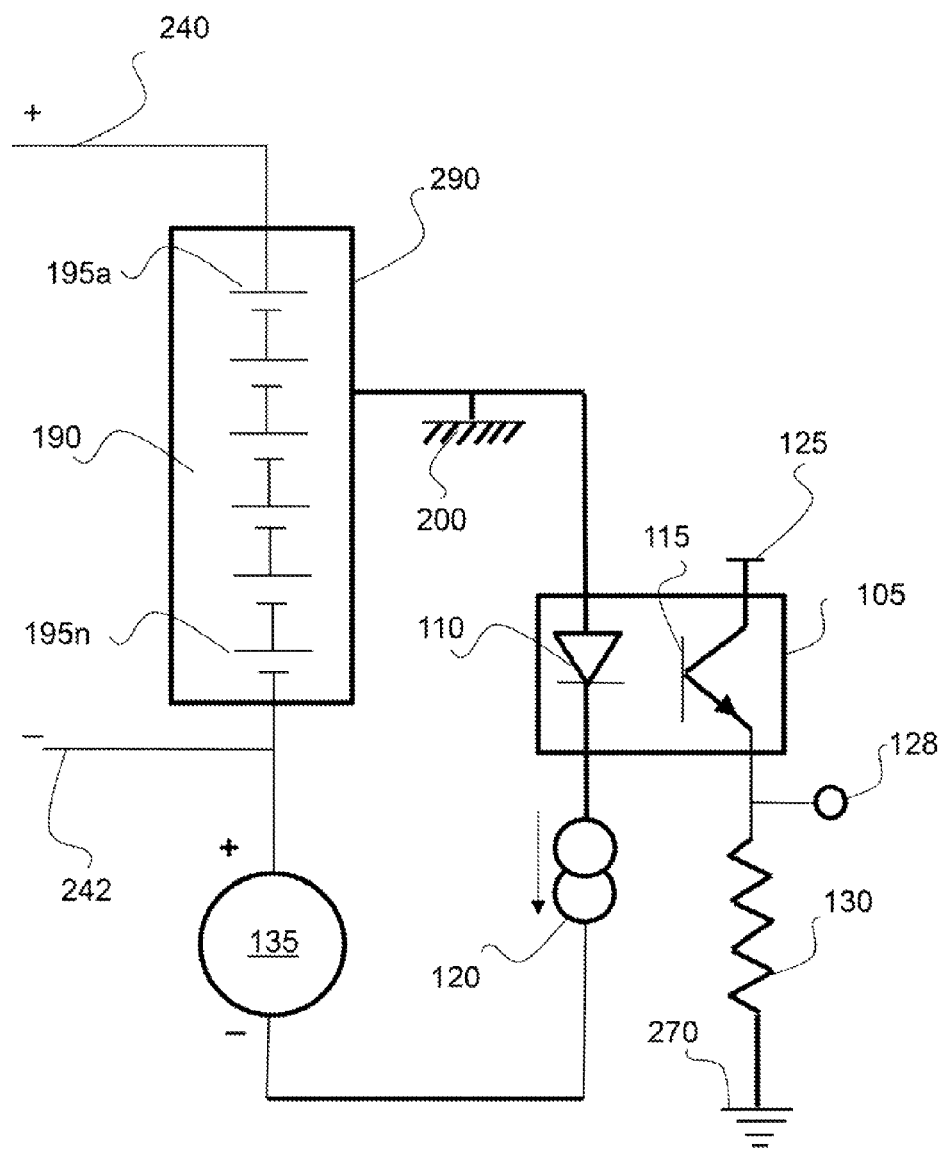
FIG. 1 is a circuit diagram depicting an exemplary embodiment of a ground fault detection system.

Referring now to FIG. 1, a circuit diagram depicting an exemplary embodiment of a ground fault detection system is shown and described. The ground fault detection system includes an optocoupler 105 having a light emitting diode 110 and a transistor 115. One terminal of the light emitting diode 110 connects to a first node or an enclosure at ground 290 (also referred to herein as "a node at a ground zero reference level 200"), such as a chassis of an electric vehicle, The other terminal of the light emitting diode 110 connects to a current sink 120. One terminal of the transistor 115 connects to a second voltage source 125. The other terminal connects to a node corresponding to the output node 128 of the optocoupler 105 (also referred to herein as the "output node"). This output node connects to a resistor 130 that also connects to a second node 270 at ground, which can be electrically isolated from the battery system, such as a different portion of the chassis of an electric vehicle. The current sink 120 connects to the negative terminal of a first voltage source 135. The positive terminal of the first voltage source 135 connects to the negative terminal 242 of battery unit 195 of the battery pack 190.

In operation, when none of the terminals of the battery units 195 connect to the enclosure 290, current does not flow through the light emitting diode 110 of the optocoupler 105. The light emitting diode 110 does not activate the transistor 115, and the transistor 115 does not conduct. Because the node 128 corresponding to the optocoupler's 105 output is disconnected from the second voltage source 125, any charge at the node drains through the resistor 130 to ground, which can be electrically isolated. In this manner, the optocoupler 105 outputs a logic low signal, such as 0V, indicating that a ground fault has not been detected.

When any terminal of a battery unit 195 does connect to the enclosure 290, which may be connected to the chassis of an electric vehicle, current flows through the light emitting diode 110 to the current sink 120. The current activates the transistor 115 so the transistor 115 conducts. Current flows from the second voltage source 125, building charge at the output node 128. Thus, the optocoupler 105 outputs a logic high signal indicating that a ground fault has been detected.

The second voltage sources 125, 135 may be selected to suit the application. For example, in some implementations, second voltage source 125 can provide, e.g., 3.3V, although it should be understood that other voltages may be used. In some implementations, voltage source 135 can provide, e.g., 5.0V. In some implementations, the current sink 120 can limit the current flowing through itself and the light emitting diode 110 to a maximum level to indicate a ground fault. For example, in some implementations, the current sink 120 may be designed to limit the current to 2 mA. The current sink 120 can operate over a range of voltages of the battery pack 190, such as the voltages between the battery pack's 190 positive 240 and negative terminals 242. In some embodiments, this range can be from about 5V to about 500V. In some embodiments, the current sink 120 can operate at voltages that exceed the voltage at the positive terminal of the battery pack 190.

Figure 2:
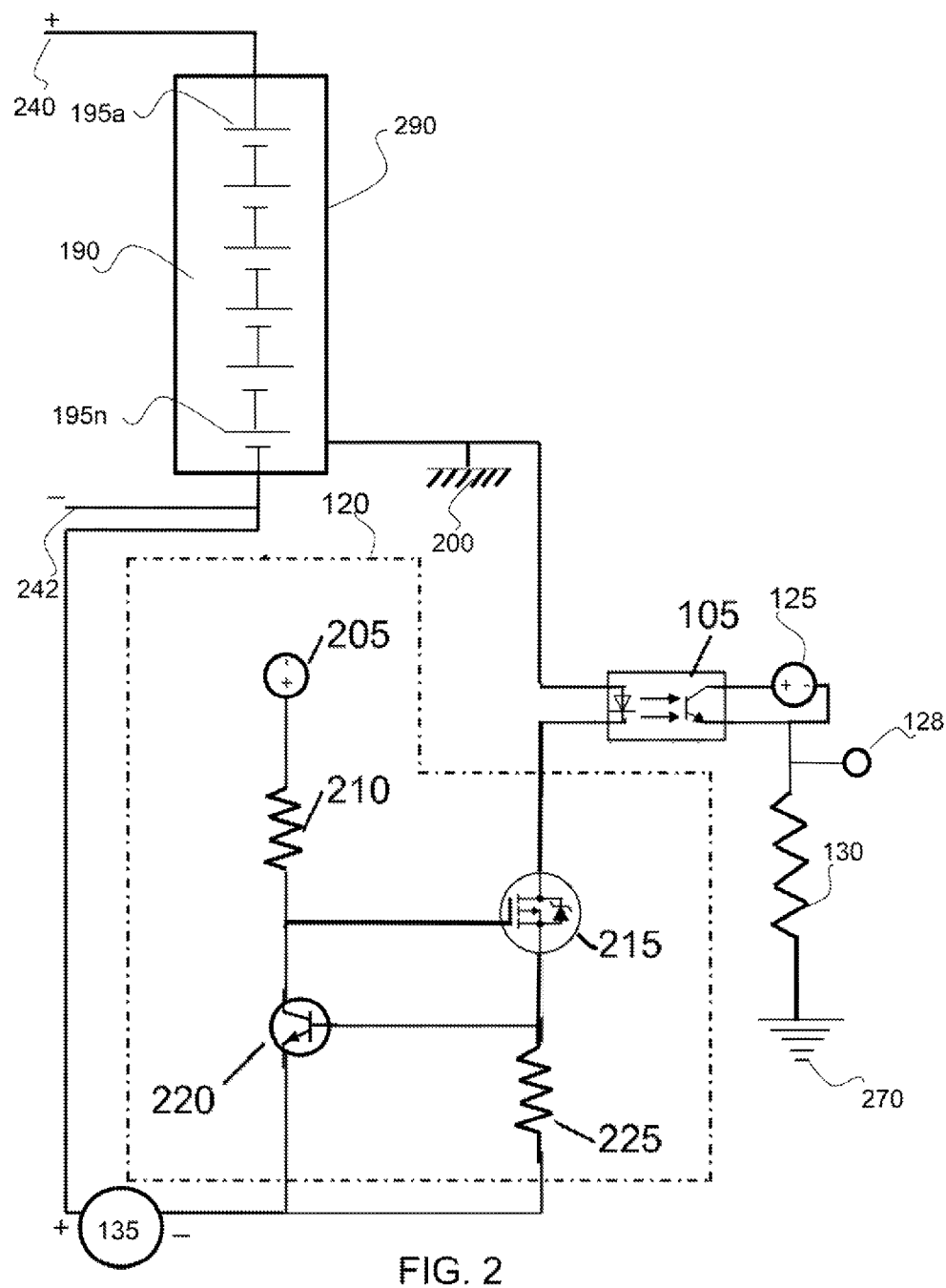
FIG. 2 is another circuit diagram depicting an exemplary embodiment of a ground fault detection system.

FIG. 2 is another circuit diagram depicting an exemplary embodiment of a ground fault detection system. The embodiment includes the optocoupler 105 and voltage source 135 of FIG. 1. The embodiment includes an exemplary implementation of a current sink 120, as indicated by the dashed line. The current sink 120 includes a third voltage source 205, a first resistor 210, a first transistor 215, a second transistor 220, and a second resistor 225. The voltage source 205 connects to one terminal of the first resistor 210. The other terminal of the first resistor 210 connects to the gate of the first transistor 215 and the emitter of the second transistor 220. The drain of the first transistor 215 connects to the optocoupler 105. The source of the first transistor 215 connects to the base of the second transistor 220 and one terminal of the second resistor 225. The other terminal of the second resistor 225 connects to the source of the second transistor 225 and the negative terminal of the voltage source 135.

In operation, current flows from the voltage source 205 through the first resistor 210 to activate the first transistor 215 such that the first transistor 215 conducts. When a positive terminal of a battery unit 195 connects to ground, i.e. the battery enclosure that is connected with a portion of a chassis of a vehicle 200, current flows through the optocoupler 105, the first transistor 215, and the second resistor 225. The voltage that develops across the second resistor 225 activates the second transistor 220. As the second transistor conducts 220, current is diverted from the gate of transistor 215. The transistors 215, 220 and resistors 210, 225 reach equilibrium such that a constant current flows through the first transistor 215.

The transistor 215 can be any type of transistor, such as a metal-oxide-semiconductor field-effect transistor (MOSFET), an insulated gate bipolar transistor (IGBT), or an NPN transistor, In some embodiments, a 2N3904-type transistor is used for the second transistor 220.

In view of the structure, functions and apparatus of the system described herein, the present disclosure provides an efficient and intelligent ground fault detection system. Having described certain embodiments of the ground fault detection system, it will now become apparent to one of skill in the art that other embodiments incorporating the concepts of the disclosure may be used. Therefore, the invention should not be limited to certain embodiments, but should encompass the spirit and scope of the claims.

What is claimed:

1. A ground fault detection system comprising:
   A single optocoupler connected to a second voltage source, a current sink, a first node at a ground zero reference level, and a second node at around:
   wherein said current sink comprises:
      a first resistor; and
      a first transistor;
   wherein said current sink is electrically connected in series between said optocoupler and a terminal of a battery pack comprising one or more battery units, and
   wherein a first voltage source. that provides a potential below the lowest potential of a battery pack, is connected in series between said current sink and said battery pack,
   wherein the first voltage source is connected to a negative terminal of a battery unit,
   wherein a first node at a zero reference level is an enclosure around portion of said battery pack; and
   wherein upon connection between a battery unit to said first node, current flows through the optocoupler and the current sink to cause the optocoupler to output a ground fault detection signal to an output node, and whereby the output node is electrically connected with said second node, and whereby said second node is electrically isolated from said first node; whereby current only flows through the ground fault detection system when the battery is electrically grounded.

2. The ground fault detection system of claim 1, wherein the first node is a chassis of an electric vehicle.

3. The ground fault detection system of claim 1, wherein the ground fault detection signal comprises a logic high signal.

4. The ground fault detection system of claim 1, wherein the optocoupler outputs a logic low signal when the current does not flow through the optocoupler.

5. The ground fault detection system of claim 1, wherein the optocoupler comprises a light emitting diode (LED) and a transistor.

6. The ground fault detection system of claim 5, wherein the connection between the terminal of the battery unit and the first node causes the current to flow through the light emitting diode, the current causes the transistor to conduct, and the transistor causes the optocoupler to output the ground fault detection signal.

7. The ground fault detection system of claim 5, wherein upon connection between the terminal of the battery unit and the first node, the current flows through the light emitting diode from the first node of the optocoupler to the second node.

8. The ground fault detection system of claim 1, wherein the second voltage source is a 3.3V source, 9. The ground fault detection system of claim 1, wherein a positive terminal of the first voltage source connects to the negative terminal of the battery unit, and a negative terminal of the first voltage source connects to the current sink.

10. The ground fault detection system of claim 1, wherein the first voltage source is a 5V source, 11. The ground fault detection system claim 1, wherein the current sink limits the current flowing through the optocoupler and the current sink to 2 mA.

12. The ground fault detection system of claim 1, wherein the current sink operates at a voltage exceeding 5V.

13. The ground fault detection system of claim 1, wherein the current sink comprises a third voltage source, one or more transistors, and one or more resistors.

14. The ground fault detection system of claim 13, wherein the third voltage source, the one or more transistors, and the one or more resistors are configured to form an equilibrium so that the current flowing through the current sink is a substantially constant current.

15. The ground fault detection system of claim 13, wherein any of the transistors comprises a MOSFET or an IGBT.

16. A ground fault detection system comprising:
optocoupler with a light emitting diode and a transistor;
wherein said optocoupler is connected to a second voltage source, a current sink, a first node at a ground zero reference level, and a second node at ground:
a current sink comprising:
a first resistor; and
a first transistor;
wherein the current sink is connected to the light emitting diode of the optocoupler;
and a first voltage source with a negative terminal connected to the current sink and a positive terminal connected to a negative terminal of a battery unit;
wherein upon connection between a positive terminal of the battery unit and a chassis of an electric vehicle,
i) current flows through the light emitting diode of the optocoupler and the current sink, and
ii) the light emitting diode activates the transistor such that the optocoupler outputs a ground fault detection signal.

17. A method of detecting a ground fault comprising:
a) providing a ground fault detection system comprising:
a single optocoupler connected to a second voltage source, a current sink, a first node at a ground zero reference level, and a second node at ground;
wherein said current sink comprises:
a first resistor; and
a first transistor;
wherein said current sink is electrically connected in series between said optocoupler and a terminal of a battery pack comprising out or more battery units, and
wherein the first voltage source that provides a potential below the lowest potential of a battery back is connected in series
between said current sink and a negative terminal of the battery unit,
wherein said first node, at a zero reference level, is an enclosure around a portion of said battery pack; and
wherein upon connection between a battery unit and said first node, current flows through said optocoupler and the current sink to cause the optocoupler to output a ground fault detection signal to an output node, and whereby the output node is electrically connected with said second node, and whereby said second node is electrically isolated from said first node:
whereby current only flows through the ground fault detection system when the battery is electrically grounded:
b) connecting a positive terminal of said first voltage source to said negative terminal of said battery unit to said first node at a ground zero reference level;
c) flowing said current through a light emitting diode of said optocoupler and a current source; and
d) activating a transistor of said optocoupler such that said optocoupler outputs said ground fault detection signal.

* * * * *